United States Patent [19]
Yen

[11] Patent Number: 5,254,375
[45] Date of Patent: Oct. 19, 1993

[54] APPARATUS FOR CONTROLLABLY SEPARATING FRAMED WORKING AREA FROM REMAINDER OF THE MEMBRANE

[76] Inventor: Yung-Tsai Yen, 196 Tuscaloosa Ave., Atherton, Calif. 94025

[21] Appl. No.: 749,709

[22] Filed: Aug. 26, 1991

[51] Int. Cl.$^5$ ............................................. A47G 1/12
[52] U.S. Cl. ........................................ 428/14; 428/45
[58] Field of Search ............... 428/14, 38, 40, 45; 156/60

[56] References Cited

U.S. PATENT DOCUMENTS

| | | | |
|---|---|---|---|
| 4,378,953 | 4/1983 | Winn | 264/311 X |
| 4,465,759 | 8/1984 | Duly et al. | 430/323 X |
| 4,470,508 | 9/1984 | Yen | 428/40 X |
| 4,737,387 | 4/1988 | Yen | 428/14 |
| 4,759,990 | 7/1988 | Yen | 428/216 X |
| 5,008,156 | 4/1991 | Hong | 430/5 X |
| 5,034,972 | 7/1991 | Schomburg et al. | 430/5 X |
| 5,085,899 | 2/1992 | Nakagawa et al. | 428/14 |

*Primary Examiner*—Henry F. Epstein
*Attorney, Agent, or Firm*—Kolisch, Hartwell, Dickinson, McCormack & Heuser

[57] ABSTRACT

Apparatus and a process for controllably separating a framed working area of a membrane from the remainder of the membrane is disclosed. The process includes tensioning an expanse of membrane material and fastening a support frame to the membrane to define a working portion of the same. A bondable polymeric material is applied to form a continuous border outward of the outer edge of the support frame. Additionally, the framed working area of the membrane is separated from the remainder of the membrane by cutting the membrane outward of the support frame.

10 Claims, 1 Drawing Sheet

APPARATUS FOR CONTROLLABLY SEPARATING FRAMED WORKING AREA FROM REMAINDER OF THE MEMBRANE

BACKGROUND OF THE INVENTION

The present invention relates to pellicles that are used in the semi-conductor chip industry, and more particularly to a method and apparatus for manufacturing pellicles.

In the semi-conductor chip industry it is well known that pattern transfer from a photo mask to a substrate is accomplished by exposing the photo mask to a light source. During the pattern transfer process, also called the photolithographic process, circuit patterns on the photo mask are projected onto the substrate which has been treated with a photo-sensitive substance. This results in the patterns being reproduced on to the substrate. Unfortunately, any foreign substance on the surface of the mask will also be reproduced on the substrate and therefore will interfere with proper pattern transfer.

To eliminate contamination of the mask surface, a framed, thin membrane known as a pellicle is mounted on it, such that the pellicle membrane extends parallel to the mask, at a predetermined distance spaced from the mask. Any contaminates which would ordinarily land on the mask surface fall onto the pellicle membrane, and not the mask. Because the frame of the pellicle supports the membrane at a spaced distance from the mask surface, particles or other contaminants on the pellicle membrane will be out of focus during pattern transfer, and therefore will not be projected onto the substrate. The use of pellicles in manufacturing integrated circuits can increase the quality of the resulting circuits, thereby dramatically improving circuit fabrication productivity.

Because high quality pellicles are critical to the success of the photolithographic process, pellicle manufacturing techniques have become increasingly important. Specifically, during the pellicle manufacturing process, it is important to minimize the possibility of contaminant particles being deposited on the pellicle membrane.

In the event of a relatively large particle being deposited on the pellicle membrane, such particle may be reproduced on the substrate during photolithography even though such particle may be out of focus. Additionally, if a contaminant particle temporarily attaches to the underside of the pellicle membrane or the pellicle frame, such particle may drop onto the mask surface and contaminate it during photolithography. This is precisely what is to be avoided by using a pellicle.

It is also critical that the pellicle membrane be extremely uniform so that light rays passing through it during photolithography are unobstructed and are not in any wa refracted or otherwise bent. The composition of the membrane must be highly uniform, and the membrane must be evenly tensioned across the pellicle frame. Also, it is important to ensure that a continuous seal exists between the thin film and the frame.

To further understand these important requirements, it is necessary to provide an explanation as to how pellicles are formed.

As is known in the art, forming an optical membrane is the first step in pellicle manufacture. Commonly the membrane is prepared by spinning a suitable polymer, such as nitrocellulose or a nitrocellulose-containing polymer, on a substrate. The newly formed membrane is then removed from the substrate and held, adjacent its periphery under tension, to prepare it for subsequent manufacturing steps.

Next, a frame is fastened, or bonded, to a working area of the membrane, framing the working area. After fastening, the frame and the attached working area of the membrane are ready to be separated from the remainder of the membrane. It is this separating step that is of the utmost importance to high quality pellicle manufacture. For it is during the separating step that the framed working area must be cut away from the remainder of the membrane. Using the method and apparatus of the present invention a surprisingly successful separation is obtained.

Currently, it is known to remove the framed working area by cutting the membrane outward of the frame using a suitable knife, or razor blade. The problem with such a procedure is that the initial puncturing of the membrane by the knife causes shattering of the non-working area which produces contaminant particles that may collect on the frame or the working area.

Additionally, the membrane may tear in undesired directions. If the tear continues through the bond between the frame and the membrane and into the working area, the pellicle must be rejected because it will not perform its function when the integrity of the working area is damaged.

An even greater problem exists when the working area has been microscopically distorted due to a variation in the tension across it. This type of distortion, which may not be visible to the naked eye(s) of quality control personnel, can affect the uniformity of the membrane. Because it is essential that the pellicle membrane transmit light uniformly without refraction/bending, this distortion can have catastrophic consequences. While equipment can be, and often is, used to detect such problems in the membrane, such equipment is expensive and its use can slow down the production process.

Accordingly, it is a general object of the present invention to provide a unique, shatter-free, tear-free apparatus and method for controllably separating or removing a framed working area of a membrane from the remainder of the membrane.

SUMMARY OF THE INVENTION

One aspect of the invention comprises a method which includes the steps of: (1) tensioning a membrane; (2) fastening a frame to the membrane to define a working area of the membrane; (3) applying a solidifiable fluid to the membrane outward of the frame to form a border for reducing the membrane's tension, the border extending continuously around the periphery of the frame; and (4) separating the framed working area from the remainder of the membrane by cutting the same outward of the frame.

The novel method of the present invention may be expressed in another way by repeating the above-identified steps except that step three may also involve isolating the tension of the membrane portion that is outward of the frame and inward of the border.

Another aspect of the present invention comprises apparatus which includes (1) an expanse of tensioned membrane material, (2) a support frame for defining a working area on the expanse, the frame having an inner and outer edge, and (3) a border formed from applied solidifiable fluid for reducing tension in the membrane, the border positioned on the membrane and extending continuously around and peripherally outward of the outer edge of the frame, in continuous contact with the membrane.

By using the apparatus of the present invention, and/or by practicing the method of the present invention, the drawbacks encountered with prior art devices and methods are not experienced. Other various objects and advantages which are attained by the invention will become more fully apparent as the description which now follows is read in conjunction with the drawings.

DETAILED DESCRIPTION OF THE INVENTION

Figure 1:
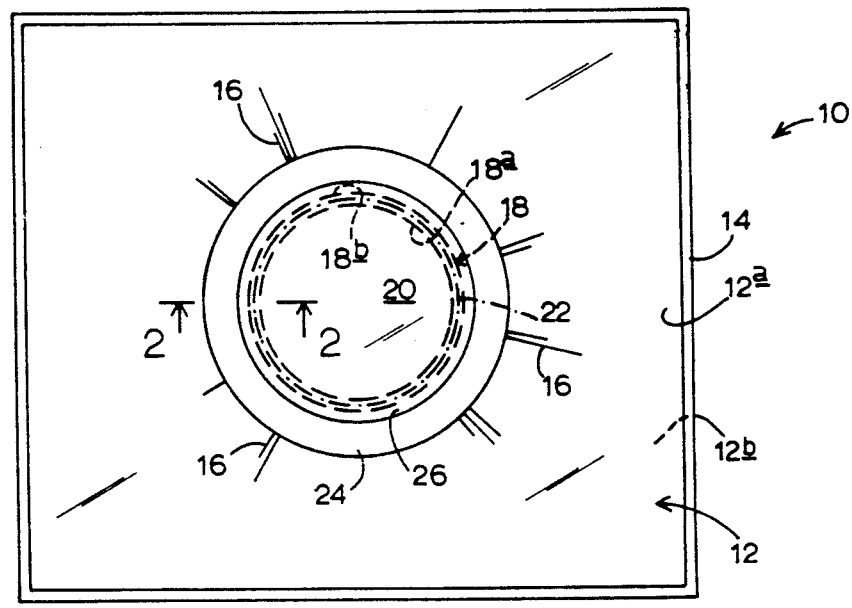
FIG. 1 is a top plan view of the apparatus of the present invention.

Turning now to the drawings, FIG. 1 shows the apparatus of the present invention at 10 with an optical membrane 12 shown, after it has been formed using the usual methods, having a first surface 12a and a second surface 12b. The membrane is held under tension by a peripheral frame 14 producing tension lines 16. The peripheral frame and membrane may be attached in a number of ways such as by adhesive, or by friction.

Next, referring again to FIGS. 1-3, a support frame 18 with inner and outer edges 18a, 18b is attached to second surface 12b and frames, or defines, a working area 20 of membrane 12. Support frame 18 may be attached to the membrane by a suitable adhesive 22, depicted in FIG. 1 by a dot-dash circle, and depicted in FIGS. 2-3 as an annular, flat adhesive layer.

Referring to FIG. 1, a border 24 formed from applied solidifiable fluid is shown positioned on the membrane and extending continuously around and peripherally outward of the outer edge of frame 18, in continuous contact with the membrane 12. Border 24 may also be characterized as means for reducing the tension of membrane 12 that is outward of outer edge 18b.

Border 24 may be formed by any solidifiable fluid or solid material that is bondable to the membrane. Preferably, the material is a bondable, solidifiable fluid polymeric material, such as a hot-melt glue.

To apply the fluid, a manual or computer-controlled dispensing operation could be utilized. In the case of using hot-melt glue, the glue solidifies immediately upon application to the membrane. To successfully reduce the tension of the membrane, border 24 must be formed outwardly of outer edge 18b to surround continuously the entire periphery thereof.

Figures 2, 3:
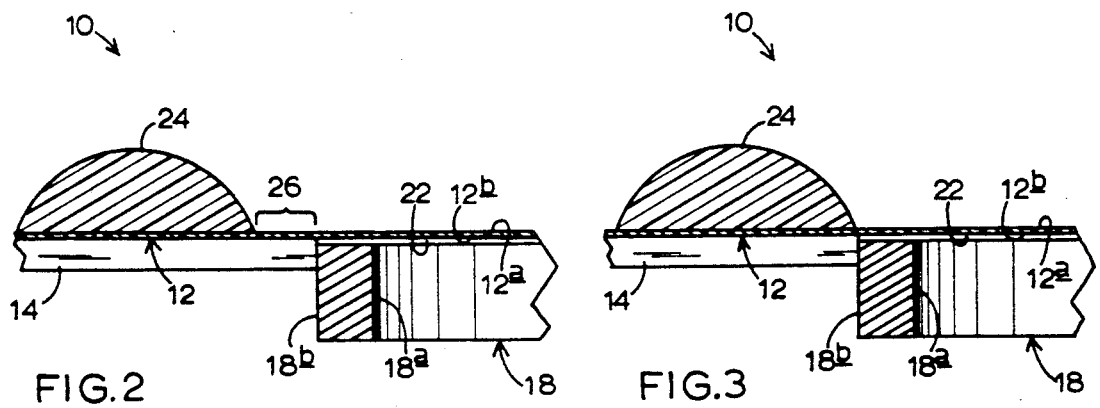
FIG. 2 is an enlarged, side sectional view taken along line 2—2 of FIG. 1.
FIG. 3 is the same view as FIG. 2 showing a variation of the embodiment of FIG. 1.

A section 26 of membrane 12 is sandwiched between border 24 and outer edge 18b for reasons which will become apparent from the discussion of FIGS. 2-3.

Referring now to FIGS. 2 and 3, two embodiments of the apparatus of the present invention are shown, both of which utilize a hot-melt glue to form border 24. In FIG. 2, the preferred embodiment of the invention is shown with the hot-melt glue having been applied to surface 12a outward of outer edge 18b, and with section 26 separating the glue from outer edge 18b. It is in section 26 that border 24 reduces tension. The effect is to provide an area of membrane 12, i.e. section 26, that can be cut without shattering, tearing, or otherwise degrading the framed working area of the membrane.

In FIG. 3, the hot-melt glue has been applied to surface 12a around the perimeter of support frame 18 so that a portion of the glue touches outer edge 18b. In this embodiment, the section of membrane that is relieved of tension is the area of the membrane bonded to border 24. To separate the framed area of the membrane, a cut is made outward of outer edge 18b, and through border 24 and the membrane bonded to it.

Additionally, while not depicted, border 24 can be formed on surface 12b outward of the perimeter of support frame 18. If such is the case, two other embodiments of the invention are possible. A third embodiment is like that shown in FIG. 2, only the hot-melt glue is applied on surface 12b. Thus, there is a section like section 26 of FIG. 2 that separates the inside border of the bead of hot-melt glue from outer edge 18b. In another embodiment, the hot-melt glue is applied to the same area of membrane 12 as shown in FIG. 3, only that the hot-melt glue is applied to surface 12b rather than surface 12a.

In operation, the above-described border 24 surprisingly allows a conventional cut to be made outward of outer edge 18b of support frame 18 without the usual problems of membrane shattering and tearing. In the first embodiment shown in FIG. 2, a knife (undepicted) can be used to cut into section 26 between outer edge 18b and border 24. Alternatively, a solvent can be used to cut through section 26. Referring back to FIG. 1, section 26 is shown as an annular section outward of outer edge 18b. When the cut is made through section 26, the cut is made in a region that is under reduced, or possibly no tension, and thus the shattering and tearing problems encountered using prior art devices and method are not a possibility.

Similarly, using the second embodiment shown in FIG. 3, a knife can be used to separate the framed working area from the remainder of membrane 12 by cutting the membrane outward of outer edge 18b either through the hot-melt glue and the membrane, or outward of the hot-melt glue and through the membrane alone.

After separating the framed working area of the membrane from the remainder of the membrane, any known trimming method may be used to trim away stray membrane portions (undepicted) extending from outer edge 18b. For example, a solvent may be applied to the stray portions to dissolve them.

Accordingly while the preferred method of practice in the present invention and preferred embodiments of the apparatus of the present invention have been described, other variations and modifications are possible and may be made without departing from the spirit of the invention.

It is claimed and desired to secure by Letters Patent:

1. Apparatus for forming a defined working area of a membrane that is controllably separable from the remainder of the membrane, comprising:

an expanse of tensed membrane material having first and second surfaces;

a support frame for defining a working area on the expanse, the support frame having an inner and outer edge; and a border formed from applied solidifiable fluid for reducing tension in the membrane, the border positioned on the membrane and extending continuously around and peripherally outward of the outer edge of the support frame, and in continuous contact with the membrane.

2. The apparatus of claim 1, wherein the fluid applied to form the border is positioned on the first surface of the membrane material and the support frame is positioned on the second surface of the membrane material.

3. The apparatus of claim wherein the border comprises a layer of bondable material that is applied to the expanse outward of the outer edge of the support frame.

4. The apparatus of claim 3, wherein the bondable material is a polymeric material.

5. The apparatus of claim 3, wherein the layer of bondable material is adjacent the outer edge of the support frame.

6. The apparatus of claim 1, wherein the fluid applied to form the border comprises hot-melt adhesive that is coupled to the expanse outward of the outer edge of the support frame.

7. The apparatus according to claim 1 or 2, wherein the expanse is formed of nitrocellulose.

8. The apparatus according to claims 1 or 2, wherein the support frame defines a working area which comprises only a portion of the membrane.

9. The apparatus of claim 4, wherein the polymeric material touches the outer edge of the support frame.

10. The apparatus of claim 9, wherein the support frame is fastened to the expanse by adhesive.

* * * * *